United States Patent
Xiao et al.

(10) Patent No.: US 9,590,630 B2
(45) Date of Patent: *Mar. 7, 2017

(54) APPARATUS FOR MIXED SIGNAL INTERFACE CIRCUITRY AND ASSOCIATED METHODS

(71) Applicant: Silicon Laboratories Inc., Austin, TX (US)

(72) Inventors: Jinwen Xiao, Austin, TX (US); Pavel Konecny, Asker (NO); Axel Thomsen, Austin, TX (US); Clayton Daigle, Austin, TX (US); Xiaodong Wang, Austin, TX (US); John Khoury, Austin, TX (US); Alan Westwick, Austin, TX (US); Shahram Tadayon, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/993,083

(22) Filed: Jan. 11, 2016

(65) Prior Publication Data
US 2016/0126955 A1    May 5, 2016

Related U.S. Application Data

(63) Continuation of application No. 14/530,089, filed on Oct. 31, 2014, now Pat. No. 9,236,867, which is a
(Continued)

(51) Int. Cl.
*G06F 15/78* (2006.01)
*H03K 19/0175* (2006.01)
(Continued)

(52) U.S. Cl.
CPC ..... *H03K 19/017581* (2013.01); *H01L 25/00* (2013.01); *H03K 19/017509* (2013.01); *H01L 2924/0002* (2013.01)

(58) Field of Classification Search
CPC ....... H01L 27/24; G06F 15/7842; G06F 15/78
(Continued)

(56) References Cited

U.S. PATENT DOCUMENTS 5,068,603 A    11/1991  Mahoney
5,321,845 A     6/1994  Sawase et al.
(Continued)

OTHER PUBLICATIONS

R. Timothy Edwards et al., "Analog Module Architecture for Space-Qualified Field-Programmable Mixed-Signal Arrays," 8 pgs., 1999.
(Continued)

*Primary Examiner* — Christopher Shin
(74) *Attorney, Agent, or Firm* — Law Offices of Maximilian R. Peterson

(57) ABSTRACT

An integrated circuit (IC) includes a plurality of pads adapted to send or receive signals, and a plurality of mixed signal interface blocks, each of which is coupled to a corresponding pad in the plurality of pads. Furthermore, each mixed signal interface block in the plurality of mixed signal interface blocks is adapted to be configurable to provide selected functionality independently of the other mixed signal interface blocks.

20 Claims, 16 Drawing Sheets

Related U.S. Application Data continuation of application No. 13/731,080, filed on Dec. 30, 2012, now Pat. No. 8,880,749.

(60) Provisional application No. 61/666,837, filed on Jun. 30, 2012.

(51) Int. Cl.
 H01L 25/00 (2006.01)
 *H01L 27/24* (2006.01)

(58) Field of Classification Search
 USPC ............... 710/8, 100; 716/100; 327/564
 See application file for complete search history.

(56) References Cited

U.S. PATENT DOCUMENTS

| | | | |
|---|---|---|---|
| 5,600,845 A | 2/1997 | Gilson | |
| 5,644,496 A | 7/1997 | Agrawal et al. | |
| 5,793,778 A * | 8/1998 | Qureshi | G01R 31/31853 714/727 |
| 5,825,712 A | 10/1998 | Higashi et al. | |
| 6,314,551 B1 | 11/2001 | Borland | |
| 6,562,995 B1 | 5/2003 | Lan-Hargest et al. | |
| 6,798,069 B1 | 9/2004 | Ali et al. | |
| 7,113,417 B2 | 9/2006 | Pochmuller | |
| 7,750,474 B1 * | 7/2010 | Wang | H01L 23/525 257/758 |
| 2007/0001240 A1 | 1/2007 | Mallikarjunaswamy et al. | |
| 2007/0011542 A1 * | 1/2007 | Mukherjee | G01R 31/31854 714/738 |
| 2008/0272803 A1 | 11/2008 | Balasubramanian et al. | |
| 2009/0251160 A1 | 10/2009 | Miyazaki | |
| 2010/0134183 A1 | 6/2010 | Miyazaki et al. | |
| 2010/0301897 A1 * | 12/2010 | Heaton | H03K 19/17704 326/38 |
| 2012/0161808 A1 | 6/2012 | Elias | |
| 2013/0043939 A1 | 2/2013 | Kothari et al. | |

OTHER PUBLICATIONS

Tim Edwards, "A Field-Programmable Analog Array," available at http://opencircuitdesign.com/~tim/research/fpaa/fpaa.html.
Suma George et al., "A Programmable and Configurable Mixed-Mode FPAA SoC," 9 pgs., 2016.
"AN121E04 Datasheet Enhanced I/O Reconfigurable FPAA," Anadigm Ltd., 21 pgs., 2003.
"AN231E04 Datasheet Rev 1.2 3rd Generation Dynamically Reconfigurable dpASP," Anadigm Ltd., 21 pgs., 2003.
Sunny Bains, *Analog's Answer to FPGA opens field to masses*, EE Times (Feb. 21, 2008), 4 pp.
*AN120E04 Datasheet: Reconfigurable FPAA*, Anadigm Ltd. (2003), 21 pp.

* cited by examiner

APPARATUS FOR MIXED SIGNAL INTERFACE CIRCUITRY AND ASSOCIATED METHODS

CROSS-REFERENCE TO RELATED APPLICATIONS

This application is a continuation of U.S. patent application Ser. No. 14/530,089, filed on Oct. 31, 2014, titled 'Apparatus for Mixed Signal Interface Circuitry and Associated Methods,' which is a continuation of U.S. patent application Ser. No. 13/731,080, filed on Dec, 30, 2012, titled 'Apparatus for Mixed Signal Interface Circuitry and Associated Methods,' which claims priority to U.S. Provisional Patent Application No. 61/666,837, filed on Jun. 30, 2012, titled 'Apparatus for Mixed Signal Interface Circuitry and Associated Methods.' The foregoing applications are incorporated by reference in their entireties for all purposes.

TECHNICAL FIELD

The disclosed concepts relate generally to electronic circuitry and, more particularly, to apparatus for interface circuitry or blocks in mixed signal integrated circuits (ICs), and associated methods.

BACKGROUND

Modern ICs have helped to integrated electronic circuitry to decrease size and cost. As a consequence, modern ICs can form complex circuitry and systems. For example, virtually all of the functionality of a system may be realized using one or a handful of ICs.

The result has been a growing trend to produce circuitry and systems with increased reliability, flexibility, and functionality. Such circuitry and systems may receive and operate on both analog and digital signals, and may provide analog and digital signals. Consequently, such circuitry and systems may include both analog and digital circuits that interface to one another.

SUMMARY

An IC according to one exemplary embodiment includes a plurality of pads adapted to send or receive signals. The IC further includes a plurality of mixed signal interface blocks, each mixed signal interface block in the plurality of mixed signal interface blocks coupled to a corresponding pad in the plurality of pads. Each mixed signal interface block in the plurality of mixed signal interface blocks is adapted to be configurable to provide selected functionality independently of other mixed signal interface blocks in the plurality of mixed signal interface blocks.

According to another exemplary embodiment, a mixed signal IC includes a plurality of pads adapted to send or receive signals, and a plurality of mixed signal interface blocks. Each mixed signal interface block in the plurality of mixed signal interface blocks is coupled to a corresponding pad in the plurality of pads and being dedicated to the corresponding pad in the plurality of pads. Each mixed signal interface block in the plurality of mixed signal interface blocks is adapted to be configurable to provide at least one selected function from a set of functions to interface the corresponding pad in the plurality of pads with core circuitry of the mixed signal IC.

According to yet another exemplary embodiment, a method of processing signals using a mixed signal IC includes communicating signals with circuitry external to the mixed signal IC using a plurality of pads of the mixed signal IC, and providing the communicated signals to a plurality of mixed signal interface blocks, where each mixed signal interface block in the plurality of mixed signal interface blocks is coupled to a corresponding pad to a plurality of pads. The method further includes processing the communicated signals using the plurality of mixed signal interface blocks, wherein the processing by each mixed signal interface block in the plurality of mixed signal interface blocks may be performed independently of the processing by other mixed signal interface blocks in the plurality of mixed signal interface blocks.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
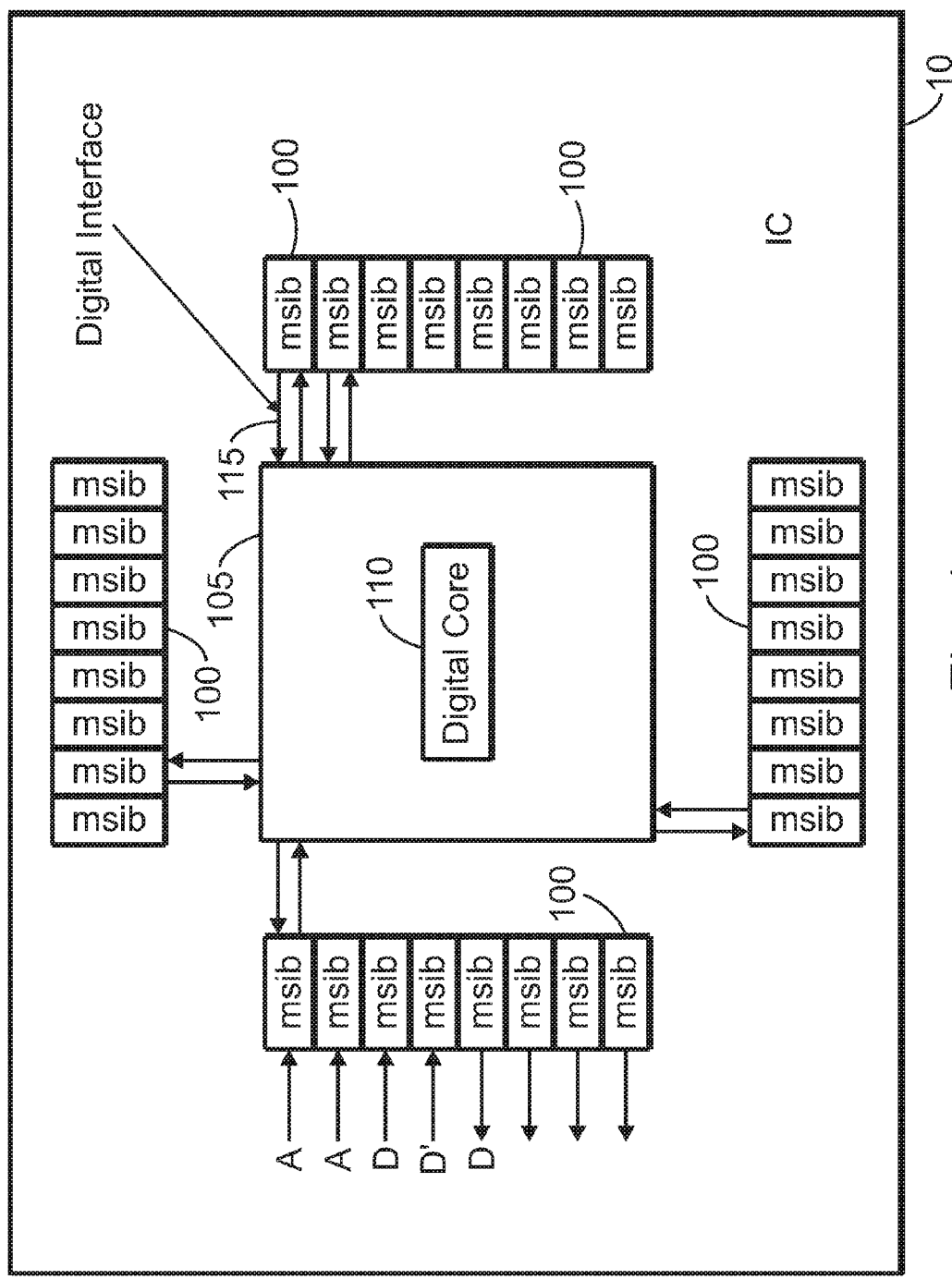
FIG. 1 illustrates a block diagram of an IC that includes a plurality of mixed signal interface blocks (MSIBs) according to an exemplary embodiment.

The disclosed concepts relate generally to providing interface circuitry in ICs. More specifically, the disclosed concepts provide apparatus and methods for mixed signal interfaces in ICs.

In illustrative embodiments, the mixed signal interfaces may be realized as mixed signal interface blocks (MSIB) or circuitry. In some embodiments, one or more MSIBs may be associated with or coupled to or configured or adapted to operate with a corresponding pad of the IC. In some embodiments, some MSIBs may be dedicated to corresponding pads of the IC (i.e., each such MSIB being coupled to or configured or adapted to operate with a corresponding pad).

MSIBs provide a variety of advantages. By using the MSIBs, flexible interface circuitry for communication or interfacing within the IC and/or with circuitry outside or external to the IC may be realized. By using the MSIBs, system on a chip (SOC) designs may be carried out without the designers have to accommodate analog interfaces or to concern themselves with resource sharing (e.g., by including a relatively large number of MSIBs, for instance, having a one-to-one correspondence between the number of the MSIBs and the corresponding pads of the IC).

From a chip assembly perspective, using MSIBs simplifies chip assembly because analog interfaces are typically local, and top level interfaces are digital and therefore suitable to automation. (The reference voltage, which typically remains an analog global signal, and the power supply grid are two exceptions.)

From a product portfolio perspective, the availability of MSIBs, which can be configured in a variety of modes, allows for a single product to cover a wide range of applications. The functions comprised in MSIBs (ADC, DAC, comparator, in various modes, plus digital input and digital output functionality, can be assigned arbitrarily.

Furthermore, application that make relatively heavy or extensive use of ADCs, sensor interfaces (temperature, pressure, etc.), may be served with the same IC including MSIBs as one that makes relatively heavy or extensive use of DACs, such as biasing an optical module, for example. This same IC, using MSIBs, could be configured to detect and produce digital signals with unusual or atypical logic thresholds in comparator mode. Some applications entail or specify a mix of all the above functions that is unique to each system. Without limitation, examples include biasing of sensors with a DAC, reading sensors with an ADC, controlling an analog input with a potentiometer, monitoring temperature for safety, sensing impedance levels on a line through DACs, and ADCs, and so on.

Such systems are sometimes controlled by software and/or firmware. If hardware resources are limited and shared, the scheduling of various tasks, such as those described above, may have to be considered, and may pose limitations. For example, worst case scheduling may have to be determined, and relatively complex software has to be written and maintained to meet the bandwidth specifications for each measurement, yet provide for measurements with relatively high priority to performed and analyzed fast enough (for example safety related tasks). If the system expands in complexity, the architecture, operations, and specifications would have to be re-analyzed and probably rescheduled.

The relative abundance of independent, simultaneously operating, and dedicated resources for IC pads provided by MSIBs simplifies this task. Each measurement can be independently and/or simultaneously scheduled without regard to what other measurements are taking place on the chip at the same time (e.g., other measurements made by MSIBs for other IC pads). The non-time critical signal such as a battery monitor does not need to find an unused timeslot between events of higher priority, and the time critical events (e.g., over-current protection) would not be delayed because of a scheduling of a less critical measurement.

Consequently, all the desired data become available in memory at the expected time, and a controller, host, or other circuit can take actions based on the available data. A more complex system that covers more tasks will not have to reconsider when and how each individual measurement is done. Existing routines can simply be integrated at the top level. The impact of the availability of a relative abundance of configurable MSIB resources at each pin on the simplicity of the software development would constitute an additional advantage.

FIG. 1 illustrates a block diagram of an IC 10 that includes a plurality of MSIBs 100 according to an exemplary embodiment. The MSIBs couple to and communicate with core circuitry 105 of the IC.

The core circuitry 105 of the IC 10 may constitute a digital core 110. The MSIBs 100 may couple to and/or interface with pads (not shown, and in some embodiments may be included with MSIBs 100) of the IC 10. As noted above, some MSIBs may be dedicated to corresponding pads of the IC (i.e., each such MSIB being coupled to or configured or adapted to operate with a corresponding pad). In such arrangements, the dedicated MSIBs may be configured, used, reused, etc., independently of, and/or simultaneously with, other pads (whether dedicated or not).

In some embodiments, the pads coupled to corresponding the MSIBs 100 may be a subset of all pads of the IC 10. In other words, in such embodiments, some pads may have corresponding dedicated MSIBs 100, while some pads may not.

In some embodiments, the pads of the IC 10 may couple to pins of the IC package. In some embodiments, the pads may couple to other circuitry, for example, via bonding wires, as might be the case for multi chip modules (MCMs).

In exemplary embodiments, the digital core 105 of the IC 10 may include a variety of digital circuits or blocks, as persons of ordinary skill in the art understand. Examples include one or more controllers, microcontrollers, processors, microprocessors, field-programmable gate arrays (FPGAs), programmable controllers, and the like. Other examples include memory (e.g., random access memory, read only memory, flash memory (or non-volatile memory generally), one-time programmable (OTP) circuitry), and the like.

Other examples of circuitry in the core (digital core or other core circuitry) of the IC 10 include counters, timers, controllers, clock and timing circuitry (including distribution circuitry), arithmetic circuitry (e.g., adders, subtracters, multipliers, dividers), general and programmable logic circuitry, gates, registers, flip-flops, multiplexers (MUXs), demultiplexers (DeMUXs), and the like. The examples provided above serve merely as illustrative embodiments. As persons of ordinary skill in the art understand, many embodiments are possible that include one or more of the above circuitry, type of circuitry, and/or other circuitry.

The MSIBs 100 provide a flexible mechanism for interfacing between the core circuitry 105 (and/or digital core 110) of the IC 10 and circuitry coupled to the pads and/or pins of the IC 10. In exemplary embodiments, some MSIBs 100 may provide analog interfaces (designated with "A" in FIG. 1) for providing input and/or output analog functionality. The analog interfaces may accommodate a variety of physical signaling schemes, such as voltage or current levels, etc., as persons of ordinary skill in the art understand.

In some embodiments, some MSIBs 100 may provide digital interfaces (designated with "D" in FIG. 1) for providing digital input and/or output functionality, for example digital interfaces using common, standard, or conventional signal levels, protocols, etc. Examples include transistor-transistor logic (TTL), complementary metal oxide semiconductor (CMOS) logic, and the like. As persons of ordinary skill in the art understand, a variety of other digital signaling schemes and protocols are possible in exemplary embodiments.

In some embodiments, some MSIBs 100 may provide digital interfaces (designated with "D" in FIG. 1) for providing digital input and/or output functionality, for example digital interfaces using unusual, proprietary, or non-common signal levels, protocols, etc. For example, such MSIBs 100 may accommodate a logic signaling scheme where a binary 0 corresponds to 2V and a binary 1 corresponds to 3V in order to decrease the signal swing and thus increase speed of operation. As persons of ordinary skill in the art understand, a variety of other digital signaling schemes and protocols are possible in exemplary embodiments.

In some embodiments, some MSIBs 100 may provide general purpose input output (GPIO) interfaces (e.g., the "digital interface" 115 in FIG. 1). In some embodiments, the GPIOs may provide analog interface capability. In some embodiments, the GPIOs may provide digital interface capability, whereas in other embodiments, the GPIOs may provide both analog and digital interface capability. In exemplary embodiments, the GPIOs may have fixed or programmable or configurable functionality, as desired, and as persons of ordinary skill in the art understand.

Figure 2:
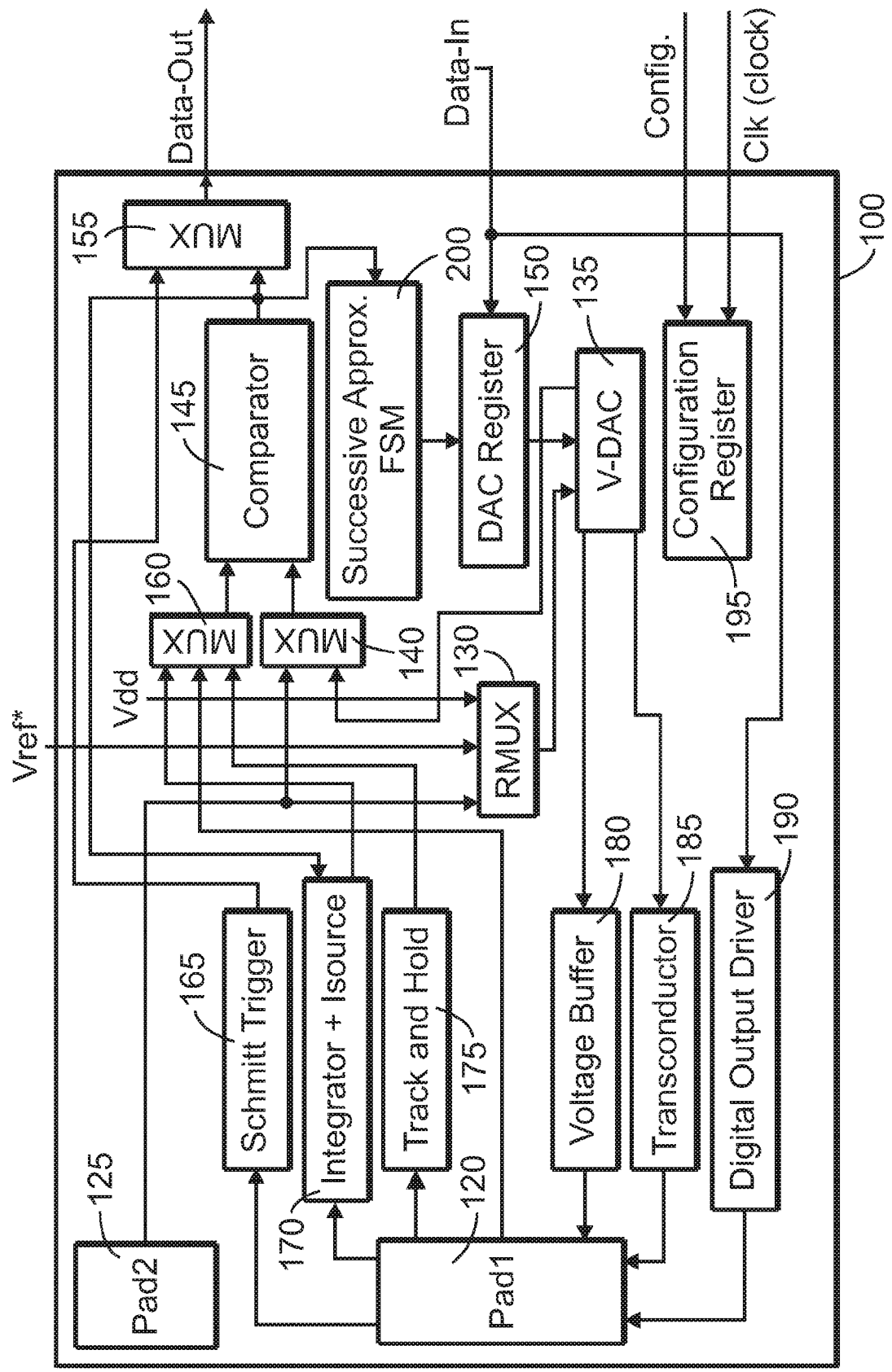
FIG. 2 shows a block diagram of an exemplary embodiment that includes a general embodiment of an MSIB.

FIG. 2 shows a block diagram of an exemplary embodiment that includes a general embodiment of an MSIB 100. In the embodiment shown, the MSIB couples to two pads 120 and 125 (labeled "pad1" and "pad2") of the IC. The MSIB 100 can provide two-pin analog and/or digital GPIO capability. The embodiment shown in FIG. 2 can provide current and voltage mode DACs, fast low resolution SAR ADC and slow high resolution delta sigma ADC), a variety of comparator modes, ratiometric conversion for ADCs and DACs, and full GPIO functionality.

An analog signal at pad2 125 is applied to the RMUX 130 (a reference multiplex unit), as are a reference voltage Vref* and a supply voltage Vdd. The output of the RMUX 130 is provided as a reference voltage to a V-DAC 135 (voltage digital-to-analog converter). In response to the reference voltage and the control signal(s) from a successive approximation (SAR) finite state machine (FSM) and DAC register, the V-DAC 135 provides an output voltage to a first MUX 140 that supplies an input signal to the comparator 145. The first MUX 140 also receives the signal at pad2 125 as another input.

The DAC register 150 controls the output of the V-DAC circuit 135, according to the equation $Vout=Vref*D/2^N$, where N represents the length of the DAC digital data word. During DAC operation, the DAC register 150 may be written to through the data input line of the MSIB.

In response to control signals (not shown), which may be, for example, derived from the configuration register, which receives MSIB configuration data in response to a clock signal "clk," the first MUX 140 provides one of its input signals to the comparator 145. The output of the comparator 145 drives a second MUX 155, which provides the output data of the MSIB.

A second input of the comparator 145 receives an output signal of a third MUX 160. The third MUX 160 receives its input signals from several blocks, including the Schmitt trigger circuit 165, the integrator/current source 170 (labeled "integrator+isource") circuit, a track and hold circuit 175, and the signal at pad1 120. In response to control signals (not shown), which may be, for example, derived from the configuration register, the third MUX 160 provides one of its input signals to the comparator 145.

The Schmitt trigger 165 in exemplary embodiments may have programmable hysteresis levels. The integrator/current source 170, along with other circuitry of the MSIB 100, may be used as a building block for a delta-sigma converter. The track and hold circuit 175 may be used to implement a SAR circuit.

Rather than receiving input signals, pad1 120 may be configured to provide output signals. More specifically, pad1 120 may supply the output of a voltage buffer 180, a transconductor 185, or a digital output driver 190. The voltage buffer 180 provides buffering of the output voltage of the V-DAC circuit 135. The transconductor 185 may convert the output voltage of the V-DAC circuit 135 to a current.

The digital output driver 190 may provide buffering or driving functionality, and may provide to pad2 125 information received from the configuration register 195 or from the input data of the MSIB 100. The digital output driver 190 may have programmable slew rate, drive strength, open drain, or standard CMOS capabilities.

The configuration register 195 receives configuration information or data for the MSIB 100. The configuration information or data may be receives from a desired source, such as the core circuitry 105 of the IC 10. The configuration register 195 can use the configuration information or data to configure or program or adapt one or more blocks or circuits in the MSIB 100, as desired, depending on the implementation for a given specification or situation. Thus, in exemplary embodiments, the configuration register 195 may provide enable, disable, parameter setting (e.g., hysteresis, slew rate, etc.) for one or more blocks or circuits of the MSIB 100.

As persons of ordinary skill in the art understand, the structure and functionality described above is exemplary, and many other configurations, structures, and functions may be realized. For example, in some embodiments, some of the blocks or circuits of the MSIB 100 may have programmable functionality and/or parameters (see above for examples). As another example, all or nearly all (e.g., excepting the MUXs) blocks in the MSIB 100 may have programmable functionality and/or parameters.

As noted above, the MSIB 100 shown in FIG. 2 supports a variety of functions or operating modes. Some of the blocks of circuitry in the MSIB 100 may not be used for a particular function or operating mode. Such blocks may in some of the appended drawings be shown with lighter gray (or dashed-line or other notation) outlines and connections. As an example, the track and hold block 175, the comparator 145, etc., are not used to implement the functionality described below with respect to the circuit shown in FIG. 3.

Figure 3:
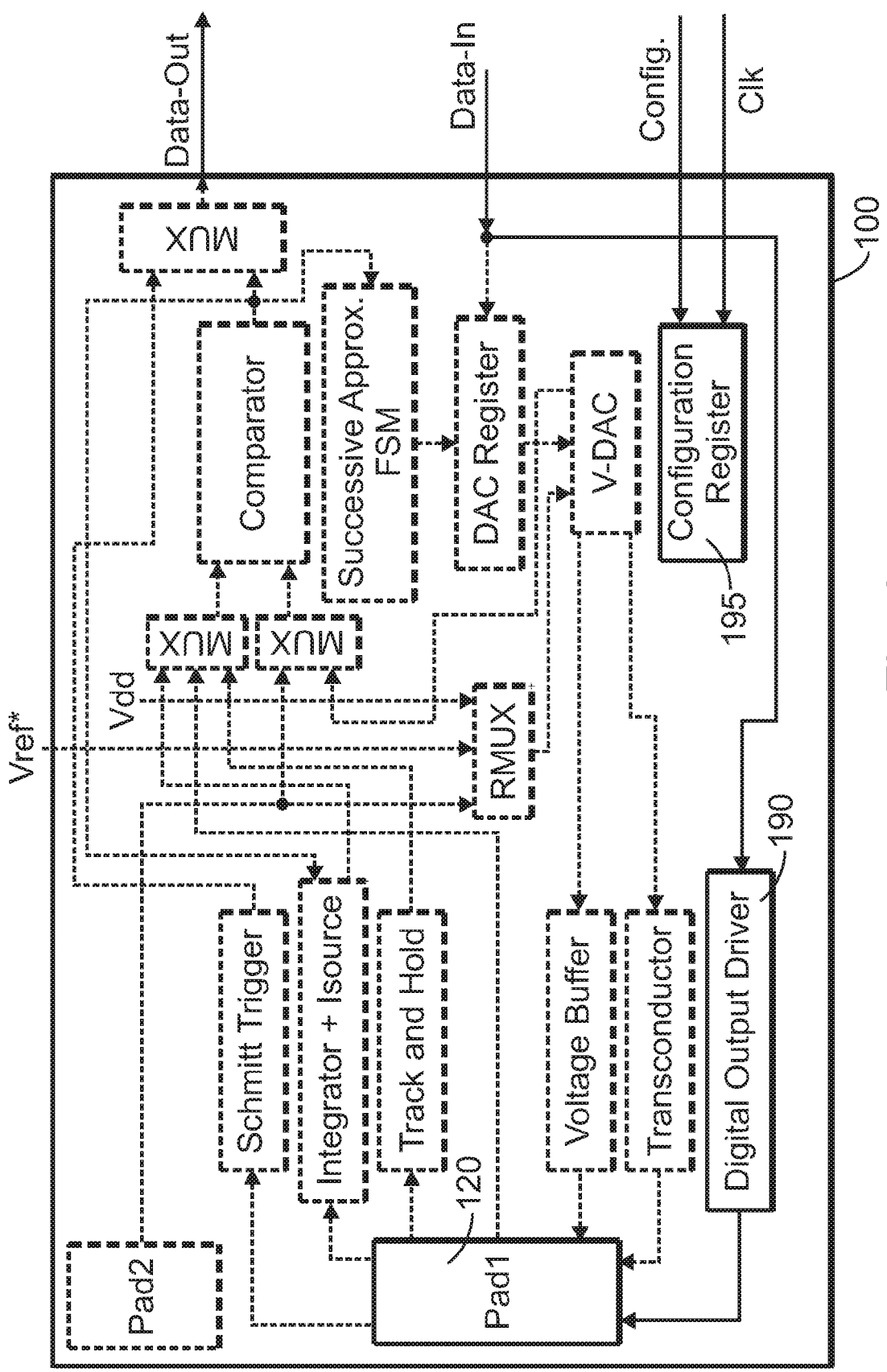
FIG. 3 shows an MSIB configured to provide digital output functionality according to an exemplary embodiment.

FIG. 3 shows an MSIB 100 configured to provide digital output functionality according to an exemplary embodiment. In this mode, pad1 120 provides as a digital output a signal received from the digital output driver 190. The digital output driver 190 buffers or processes or conditions a signal received as the data input of the MSIB 100, and provides the resulting signal to pad1 120.

In some embodiments, the MSIB 100 may uses CMOS digital circuits (e.g., standard CMOS circuits) to implement a fast CMOS output with strong drive, as desired. In some embodiments, the MSIB 100 may provide options to disable the pullup of the CMOS output (e.g., to provide open drain functionality), program the drive strength, control the slew rate, etc., as desired, and as persons of ordinary skill in the art understand.

Figure 4:
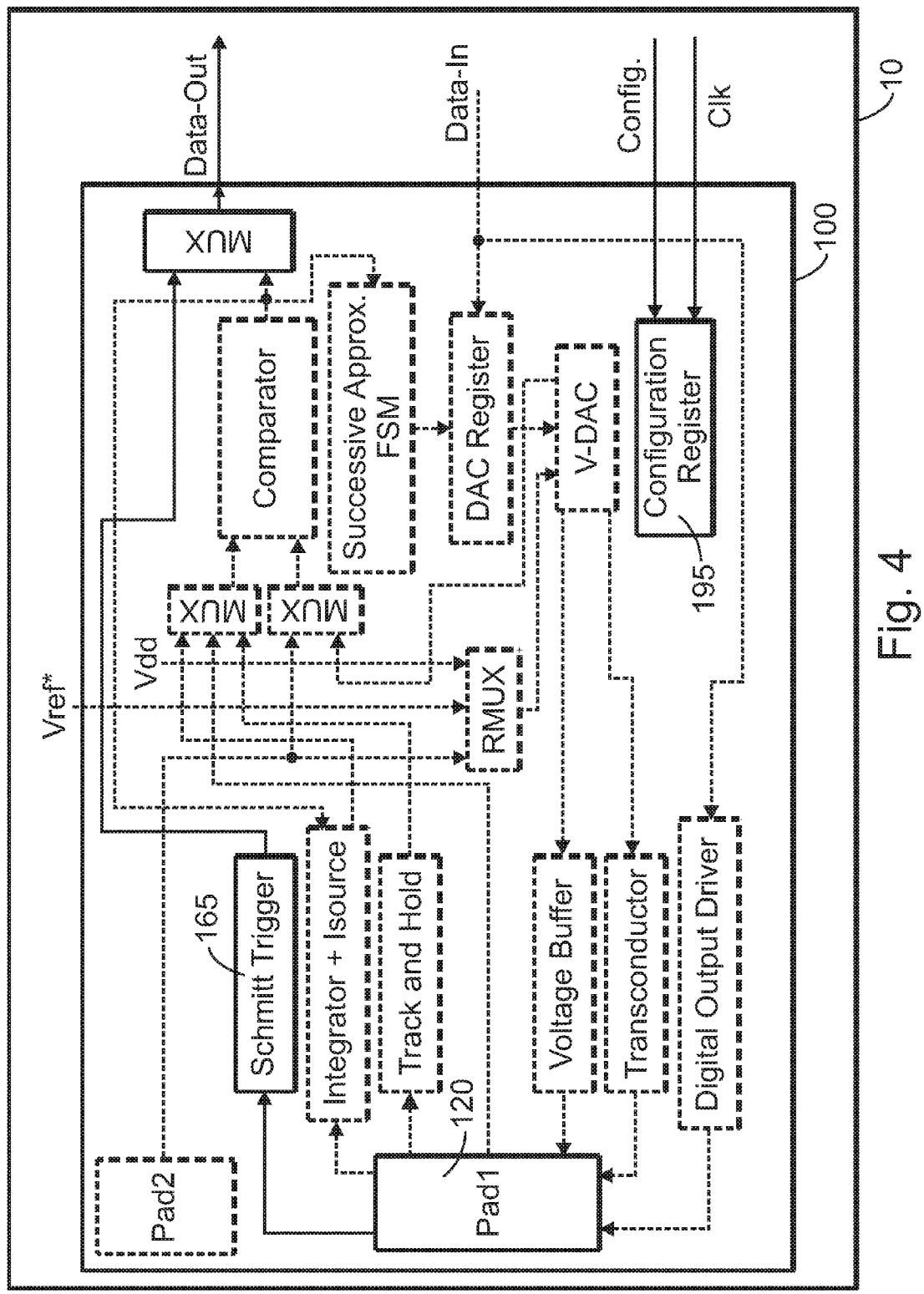
FIG. 4 shows an MSIB configured to provide digital input functionality according to an exemplary embodiment.

FIG. 4 shows an MSIB 100 configured to provide digital input functionality according to an exemplary embodiment.

In this mode, pad1 120 receives an input signal, and provides the signal to the Schmitt trigger 165. The Schmitt trigger 165 processes the input signal, and provides the resulting signal as the data output signal of the MSIB 100 via the second MUX 155.

Thus, in this mode, pad1 120 may be configured similar to a standard or typical digital input pad. The Schmitt trigger 165 implements input buffering, with optional hysteresis, which may be programmed via the configuration register 195. The functionality of the MSIB 100 in this mode may be configured or programmed for CMOS, TTL, or other input levels, as desired.

Figure 5:
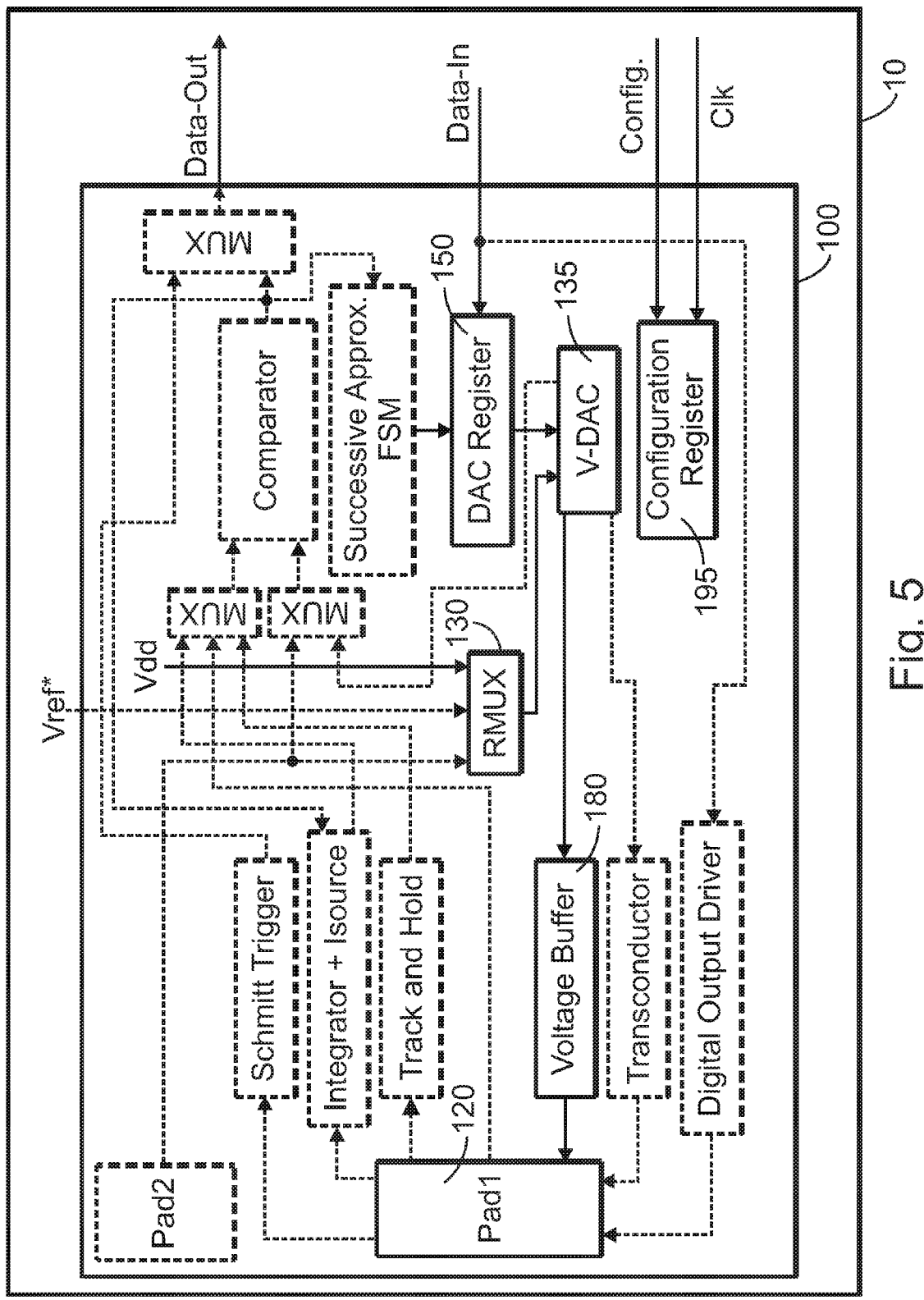
FIGS. 5-6 shows an MSIB configured to provide voltage digital to analog (DAC) functionality according to an exemplary embodiment.

FIG. 5 shows an MSIB 100 configured to provide voltage DAC functionality according to an exemplary embodiment. In this mode, the data to be converted to the analog domain may be provided to the data input of the MSIB 100, for example, by a digital circuit in the core circuitry 105 (or 110) of the IC 10.

The V-DAC circuit 135 creates an analog voltage level according to the received digital code or signal and the reference voltage provided to the V-DAC circuit 135. The digital code or signal is provided via the data input of the MSIB 100 to the DAC register 150. The DAC register 150 provides a register function, and provides the digital code or signal to the V-DAC circuit 135.

The V-DAC circuit 135 provides to the voltage buffer 180 the analog voltage that results from the digital to analog conversion. The voltage buffer 180 buffers the analog voltage and provides the resulting signal to pad1 120, which in turn provides the buffered signal to other circuitry (not shown). The voltage buffer 180 may have programmable parameters (e.g., drive strength), and may give the MSIB 100 the capability to drive pad1 120 in the presence of relatively large capacitive loads or relatively small resistive loads (or both).

Figure 6:
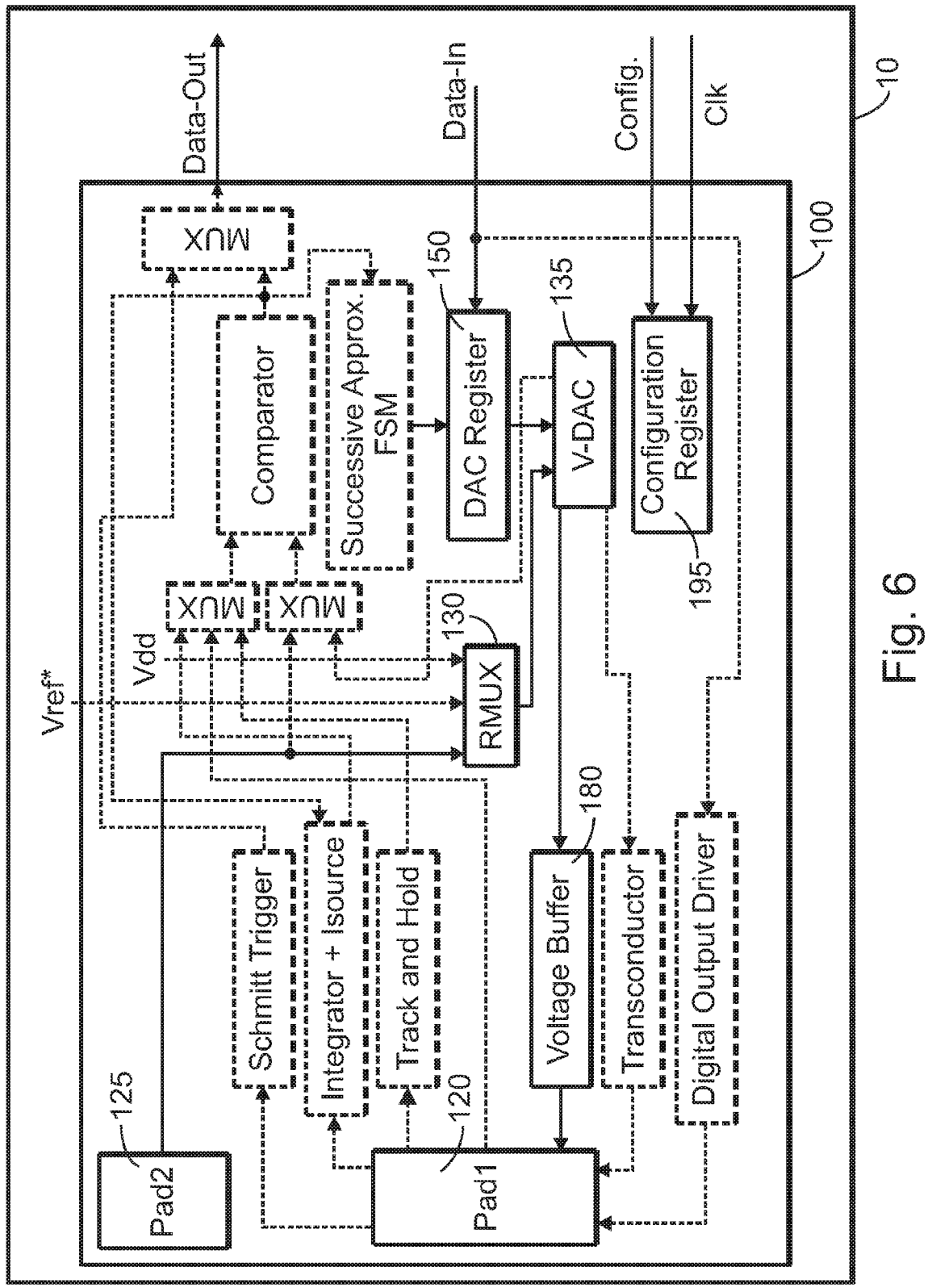

The reference voltage provided to the V-DAC circuit 135 may be a bandgap voltage generated on chip, the supply voltage of the MSIB 100, or an external reference provided to pad2 125. The RMUX 130 provides one of those voltages as the reference voltage of the V-DAC circuit 135. FIG. 6 shows the situation where a voltage provided to pad2 125 serves as the reference voltage provided to the V-DAC circuit 135.

Figure 7:
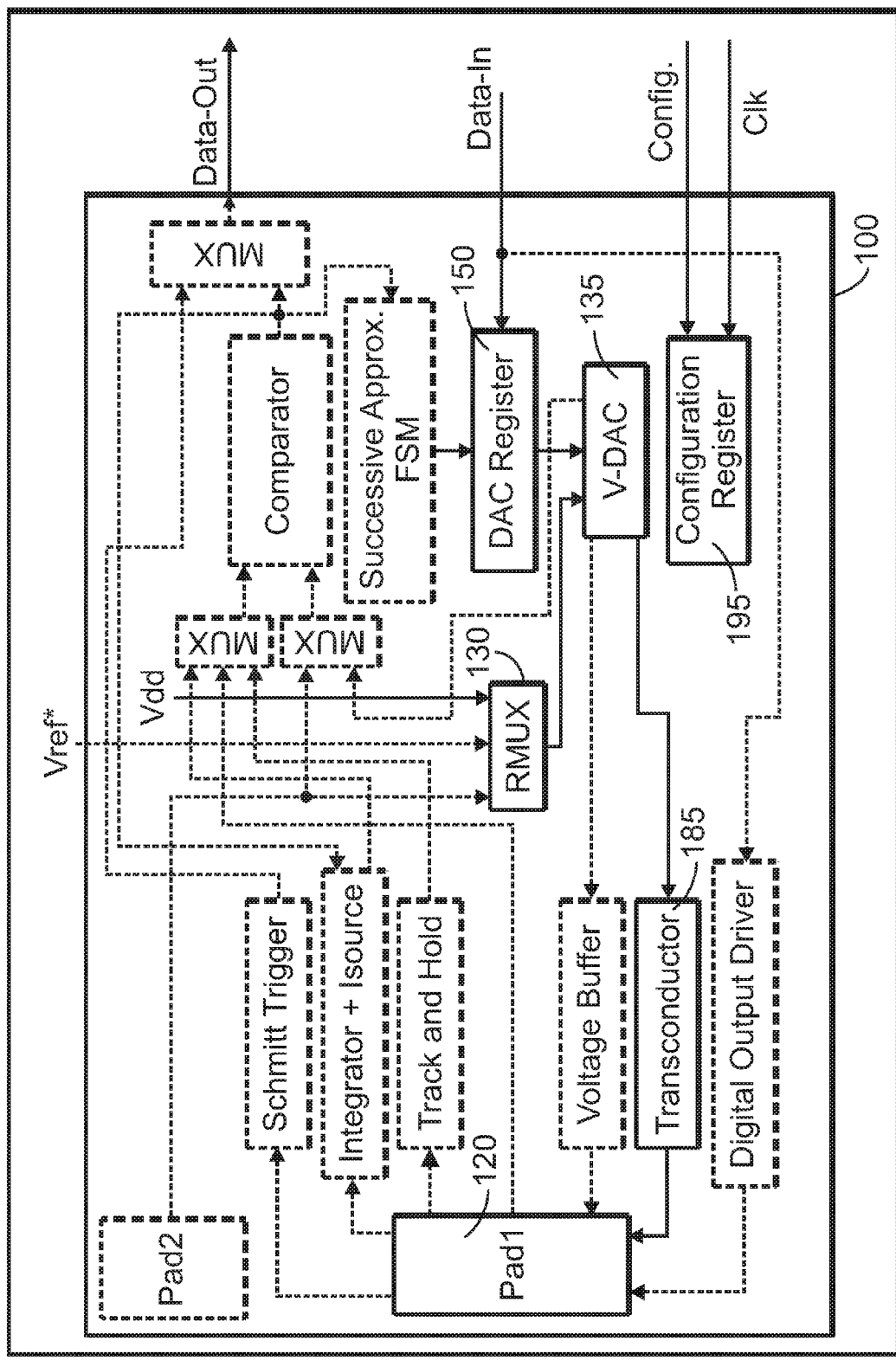
FIG. 7 shows an MSIB configured to provide current DAC functionality according to an exemplary embodiment.

FIG. 7 shows an MSIB 100 configured to provide current DAC functionality according to an exemplary embodiment. The operation of the MSIB 100 in this mode is similar to the voltage DAC functionality described above. The output voltage of the V-DAC circuit 135, however, is provided to the transconductor circuit 185.

The transconductor circuit 185 converts to an analog current the analog voltage provided by the V-DAC circuit 135. The resulting analog current is then provided to pad1 120 and, thus, ultimately to any circuit coupled to pad1 120. Similar to the voltage DAC mode, the reference signal for the V-DAC circuit 135 may be selected via the RMUX 130, as described above in detail.

Figure 8:
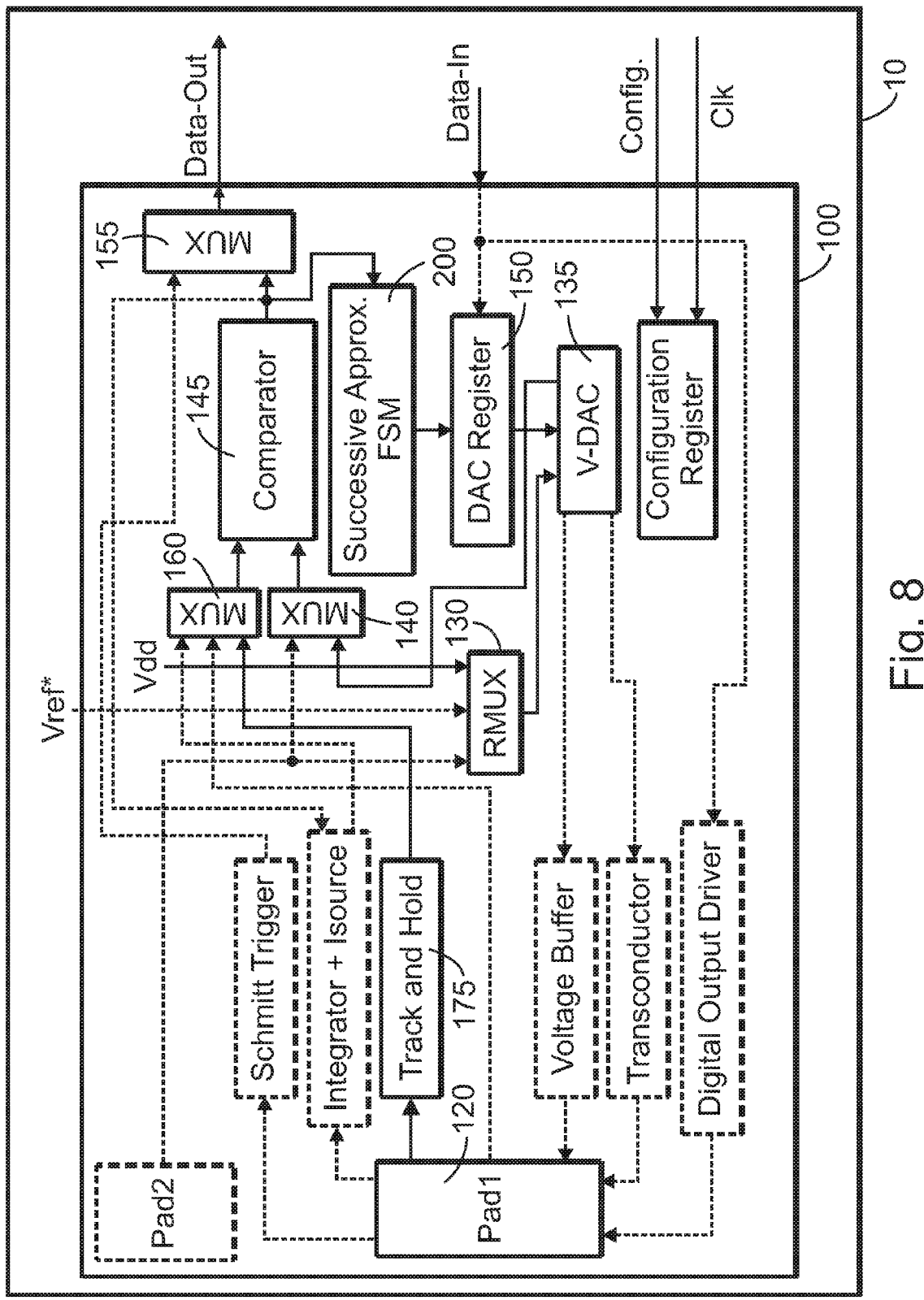
FIG. 8 shows an MSIB configured to provide successive approximation register (SAR) analog to digital (ADC) functionality according to an exemplary embodiment.

FIG. 8 shows an MSIB 100 configured to provide SAR ADC functionality according to an exemplary embodiment. In this mode, an analog signal received at pad1 125 is provided to the track and hold circuit 175. The track and hold circuit 175 samples the input signal.

The output of the track and hold circuit 175 is coupled to one input of the comparator 145. The output of the comparator 145 is provided to the successive approximation FSM 200. A successive approximation technique is used to provide digital data for ultimately driving the V-DAC circuit 135, as persons of ordinary skill in the art understand.

Briefly, for each bit position from high value to low, the bit at that position is set, then a check is made of the comparator 145 output. The bit is reset if the comparator 145 returns a signal that indicates a 'too high' level. This process is repeated for every bit position. During the ADC operation of the MSIB 100, the SAR FSM controls the DAC register 150 according to this process.

The output of the successive approximation FSM 200 feeds the input of the DAC register 150. The output of the DAC register 150 is provided to the input of the V-DAC circuit 135. The output of the V-DAC circuit 135 drives the second input of the comparator 145. Thus, a feedback circuit is formed around the comparator 145.

The output of the comparator 145 provides digital data resulting from the analog-to-digital conversion. The digital data may be provided to desired destinations, such as the core circuitry 105 (or 110) of the IC, via the data output signals/lines of the MSIB 100.

Although FIG. 8 shows the V-DAC circuit 135 as receiving the supply voltage Vdd as a reference voltage, other configurations are possible in exemplary embodiments. For example, as described above, external or internal voltages may be used as the reference voltage for the V-DAC circuit 135.

Figure 9:
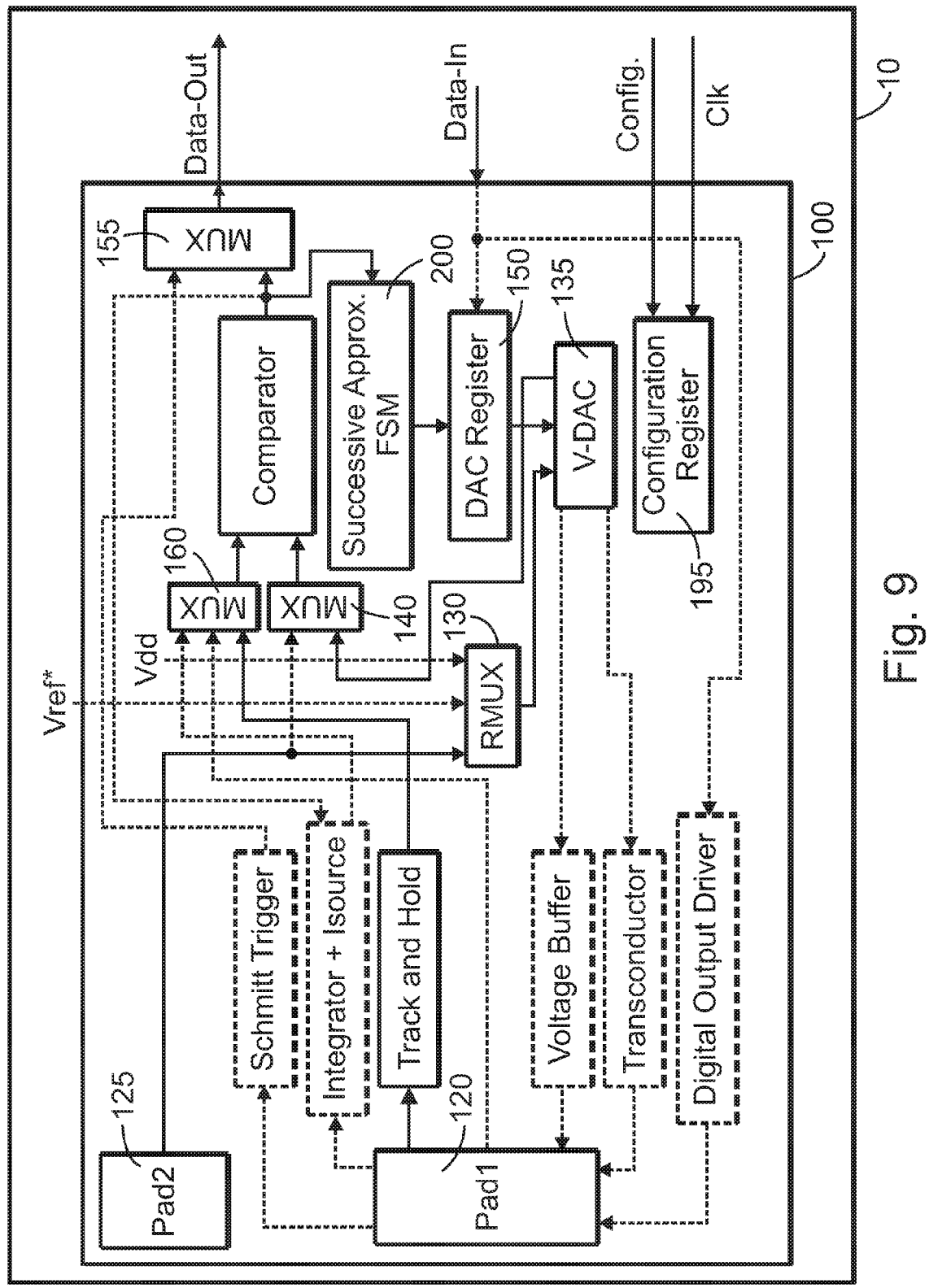
FIG. 9 shows an MSIB configured to provide ratiometric SAR ADC functionality according to an exemplary embodiment.

FIG. 9 shows an MSIB 100 configured to provide ratiometric SAR ADC functionality according to an exemplary embodiment. In this mode of an operation, an external reference voltage provided at pad2 125 may be used to implement the ratiometric SAR ADC functionality. In this mode, the analog-to-digital conversion occurs as described above, except that an analog signal received at pad2 125 is provided to the V-DAC circuit 135 as the reference voltage.

Consequently, the output digital data represent the ratio of the voltage at pad1 120 to the voltage present at pad2 125. The ratiometric ADC provides for additional functionality for the MSIB 100. Examples include measurement of impedance, potentiometer position, resistor dividers, etc., as persons of ordinary skill in the art understand.

Figure 10:
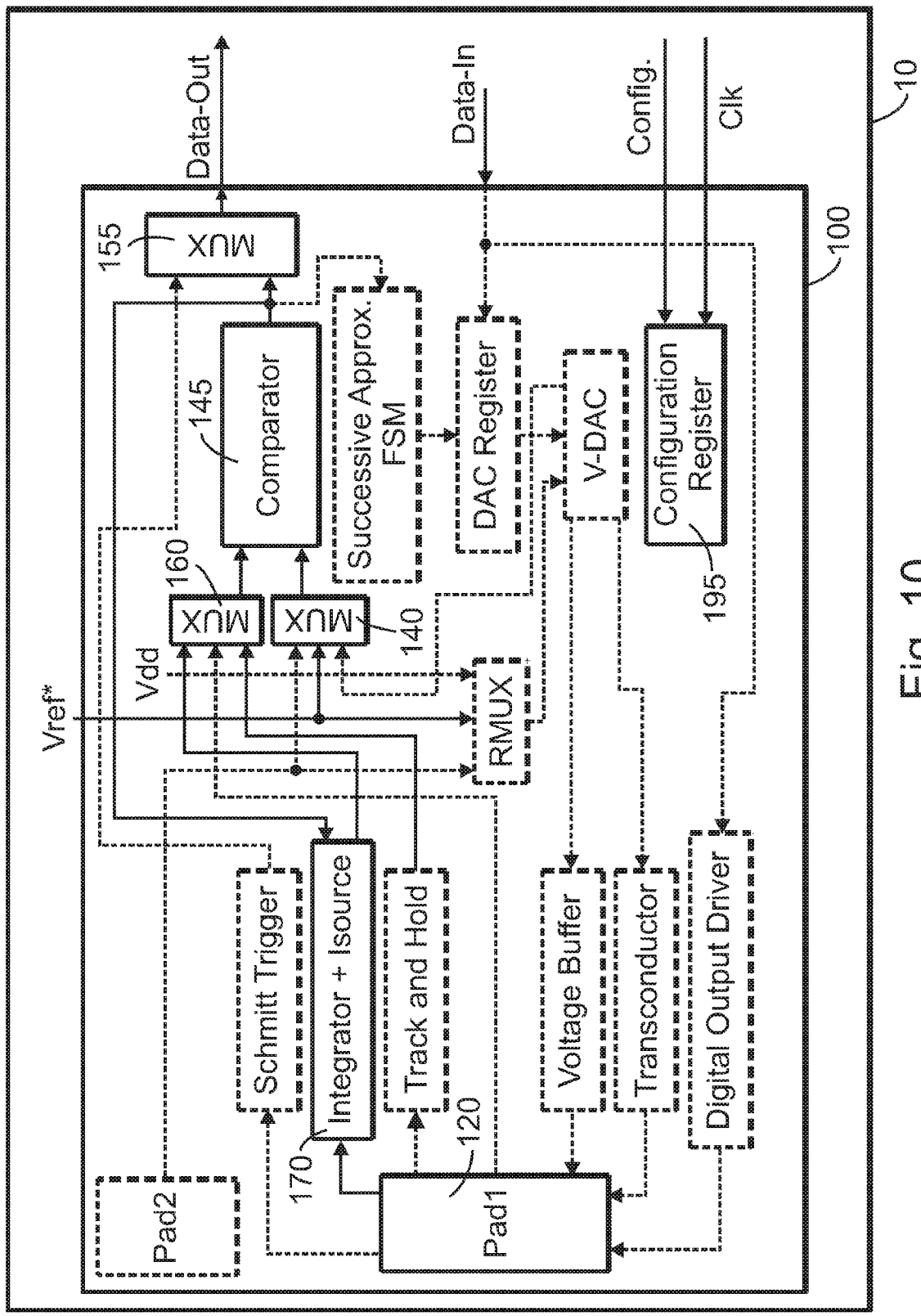
FIG. 10 shows an MSIB configured to provide delta sigma ADC functionality according to an exemplary embodiment.

FIG. 10 shows an MSIB 100 configured to provide delta sigma ADC functionality according to an exemplary embodiment. In this mode, a high precision low speed analog to digital conversion may be implemented.

The output signal of the integrator/current source circuit 170 drives one input of the comparator 145. The reference voltage Vref* drives another input of the comparator 145. The output of the comparator 145 provides a feedback signal to the integrator/current source circuit 170.

The analog voltage to be converted to the digital domain is received at pad1 125. The integrator/current source circuit 170 integrates the difference between the input voltage, as it is converted to a current to be integrated, and a feedback current source driven by the output signal of the comparator 145.

As noted above, in exemplary embodiments, the MSIB 100 includes a transconductor circuit and a voltage buffer. In some embodiments, the transconductor circuit or the voltage buffer may be used to provide the functionality of the integrator (rather than using a dedicated integrator).

Figure 11:
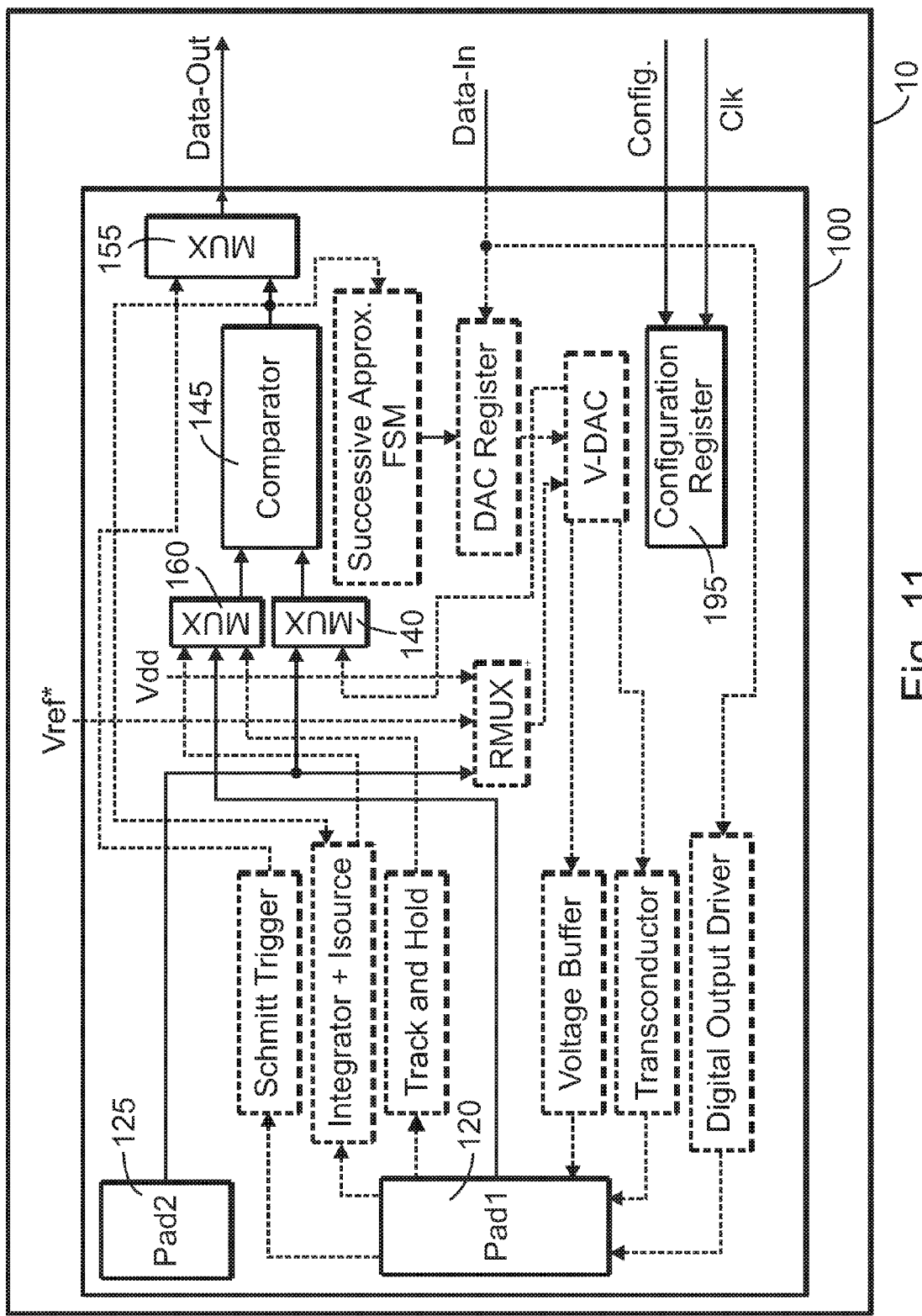
FIG. 11 shows an MSIB configured to provide differential comparator functionality according to an exemplary embodiment.

FIG. 11 shows an MSIB 100 configured to provide differential comparator functionality according to an exemplary embodiment. In this mode, signals applied to or received at pad1 120 and pad2 125 are provided to the respective inputs of the comparator 145. As a result, the comparator 145 may function as a differential comparator. (Of course, as persons of ordinary skill in the art understand, grounding pad1 120 or pad2 125 provides a single-ended, rather than differential, comparator function.)

Figure 12:
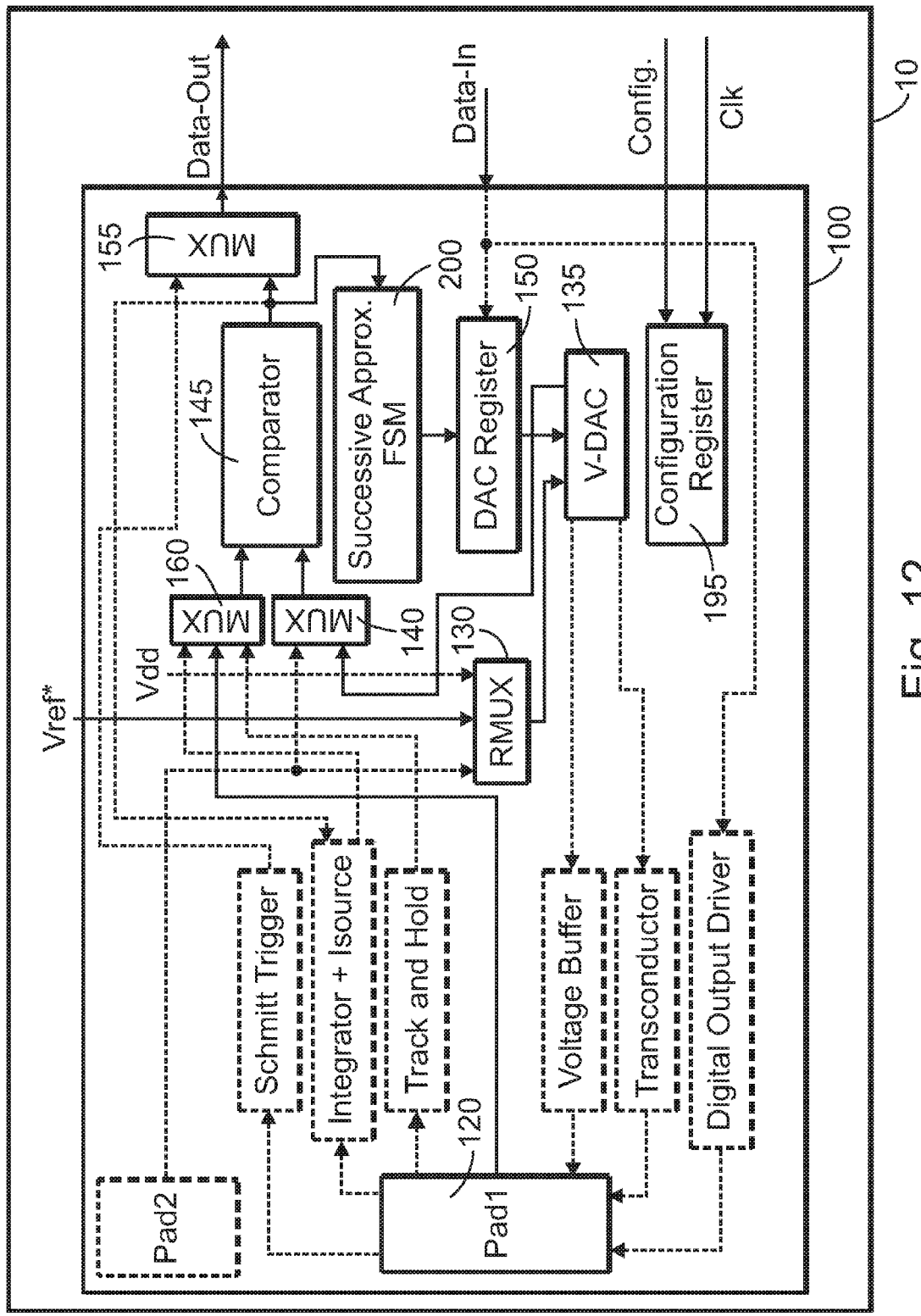
FIG. 12 shows an MSIB configured to provide the functionality of a comparator with programmable threshold, according to an exemplary embodiment.

FIG. 12 shows an MSIB 100 configured to provide the functionality of a comparator with programmable threshold, according to an exemplary embodiment. In this mode of operation, a voltage applied to pad1 120 is coupled to an input of the comparator 145. The output of the V-DAC circuit 135 is coupled to a second input of the comparator 145. The output voltage of the V-DAC circuit 135 provides the threshold voltage for the comparator 145.

The comparator 145 compares the voltages applied to its inputs, and provides a resulting output voltage via the data outputs of the MSIB 100. For example, when the input voltage at pad1 120 exceeds the output voltage of the V-DAC circuit 135 (i.e., the threshold voltage), the comparator 145 may provide a binary logic 1 as output data.

The reference voltage applied to the V-DAC circuit 135 programs the threshold of the comparator 145. As noted, a choice of reference voltages may be used. For example, in some embodiments, the supply voltage or an external voltage (applied to pad2) may be used instead of Vref* to program the comparator threshold voltage.

In some embodiments, hysteresis may be added to the comparator 145. One way of implementing the hysteresis is by adjusting the V-DAC reference level according to the previous decision of the comparator 145. For example, if the previous decision was a binary logic 1, the threshold of the V-DAC circuit may lowered, so that a noticeable change of the input voltage has to take place to return the comparator output to a binary logic 0. This operation can be useful in a variety of situations, as persons of ordinary skill in the art understand. Examples include implementing a digital interface with unusual or arbitrary signaling levels or protocols.

In some embodiments, a window comparator may be implemented, as desired. The window comparator may be implemented by a successive test to two distinct levels (corresponding to the window thresholds), and the judgment whether the input signal is inside or outside of the window.

Figure 13:
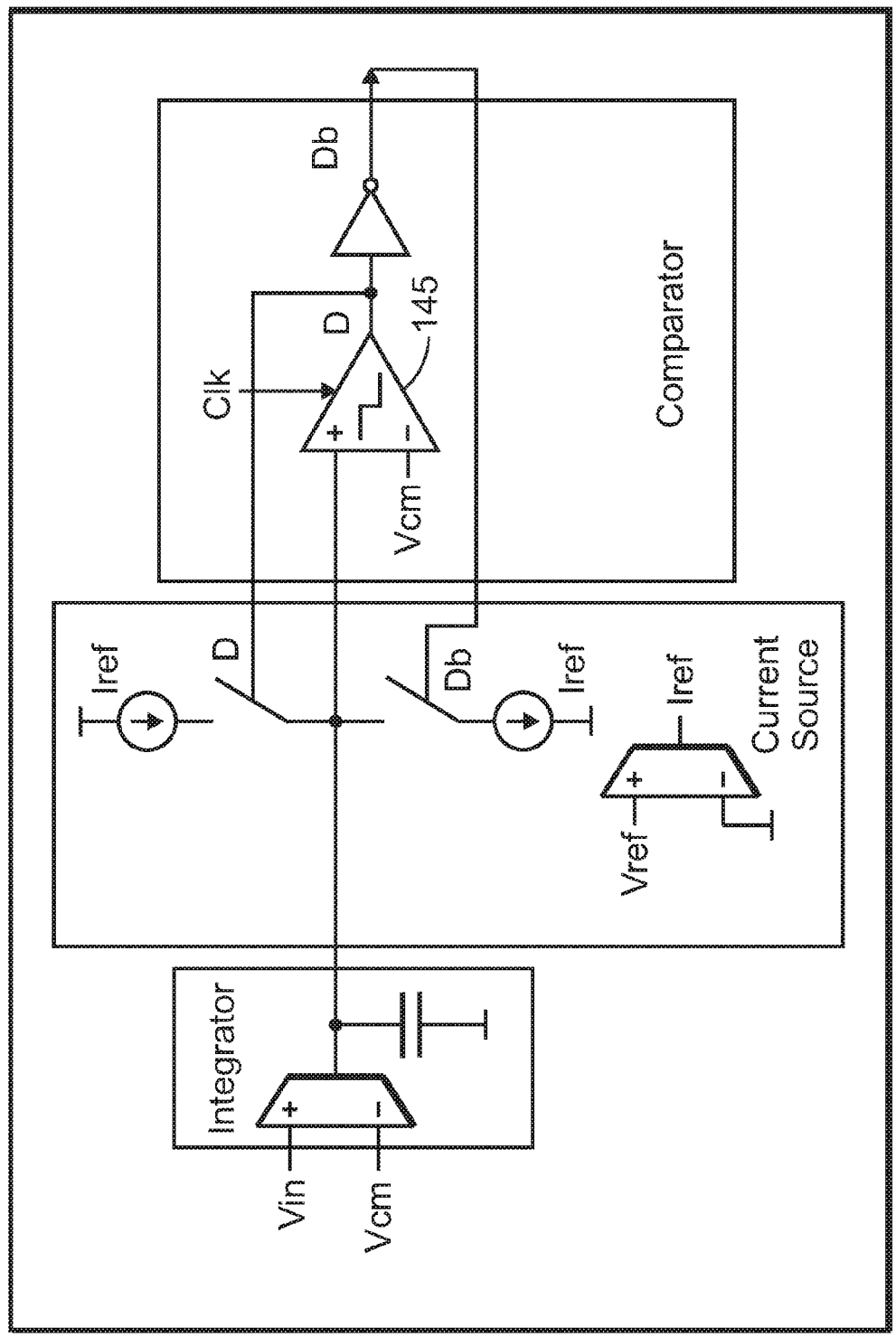
FIG. 13 shows a delta sigma modulator for an MSIB according to an exemplary embodiment.

FIG. 13 shows a delta sigma modulator for an MSIB 100 according to an exemplary embodiment. The modulator may be used in MSIB 100s to provide functionality of a delta sigma modulator.

The delta sigma modulator in the embodiment shown is implemented by integrating currents through a capacitor. The input voltage is converted to a current with a transconductor circuit. The reference voltage is also converted to a current with a transconductor circuit to generate a signal Tref.

The integrated voltage on the capacitor is observed by a comparator. The output of the comparator controls feedback in the circuit. Specifically, the output of the comparator is used to generate signals D and Db. Signals D and Db control switches that couple the current Tref to the capacitor and an input of the comparator. The output of comparator may be provided to various circuitry, such as the core circuitry of the IC.

In some implementations, the full functionality of the MSIB 100s described above may not be required or specified. In exemplary embodiments, the functionality of MSIBs 100 may be scaled to fit a given situation, a desired implementation, or a given set of specifications. The following description provides details of some exemplary embodiments with reduced or different functionality than provided in the MSIB 100 in FIG. 2.

Figure 14:
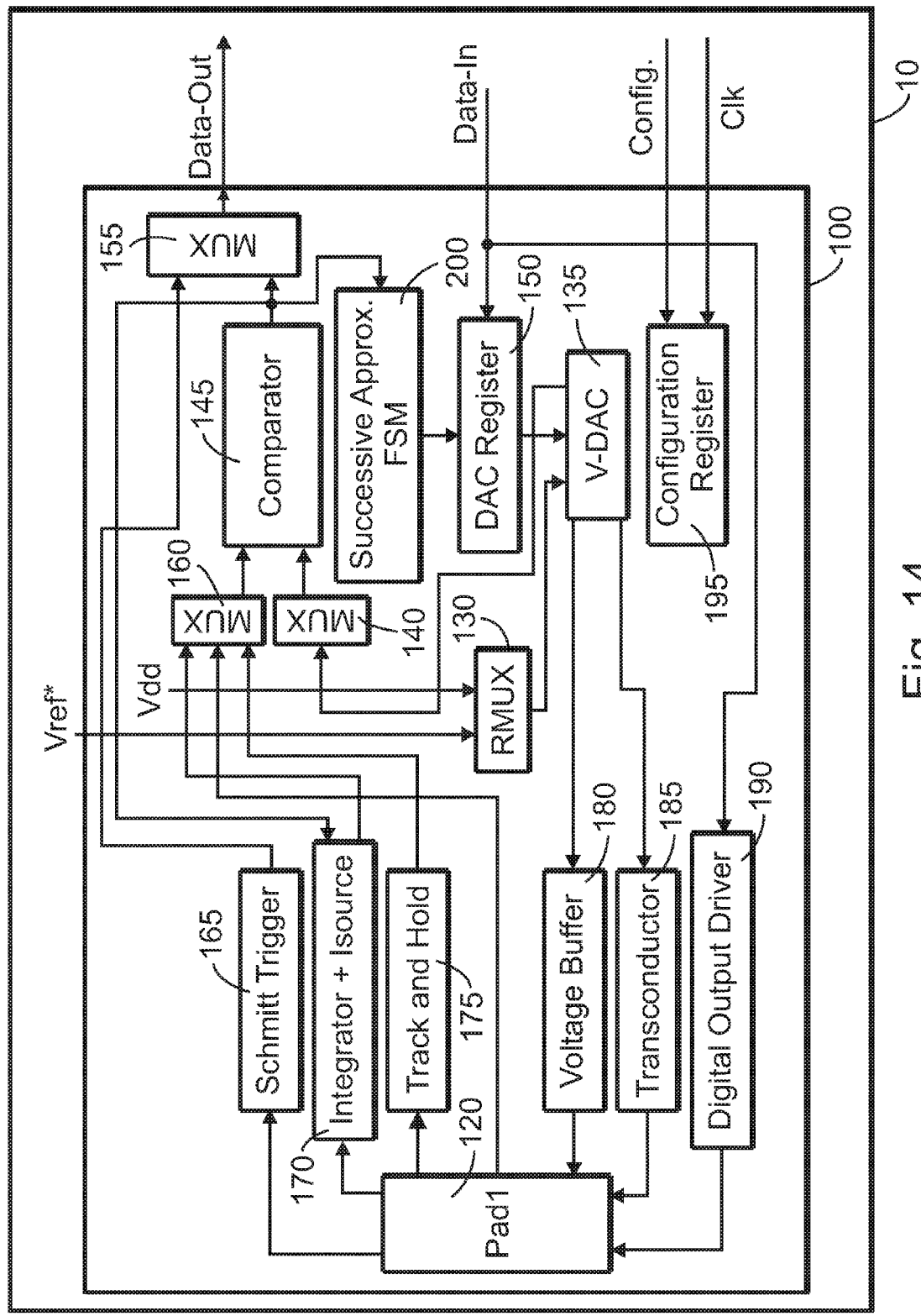
FIGS. 14-16 show block diagrams of exemplary embodiments that include general embodiments of MSIBs.

FIG. 14 shows a block diagram of an exemplary embodiment that includes a general embodiment of an MSIB 100 with reduced functionality compared to the MSIB 100 shown in FIG. 2. Specifically, the MSIB 100 shown in FIG. 14 provides analog or digital GPIO functionality for one pad (labeled as "pad1" 120). Various blocks and circuits are similar to the corresponding blocks and circuits in FIG. 2, described above in detail.

The exemplary embodiment in FIG. 14 supports various modes of operation, such as current and voltage mode DACs, relatively fast and relatively low resolution SAR ADC, relatively slow and relatively high resolution SAR ADC, comparator with programmable threshold, full GPIO functionality. The embodiment in FIG. 14 does not support differential or ratiometric functions (because they use two input signals, hence, two pads).

Figure 15:
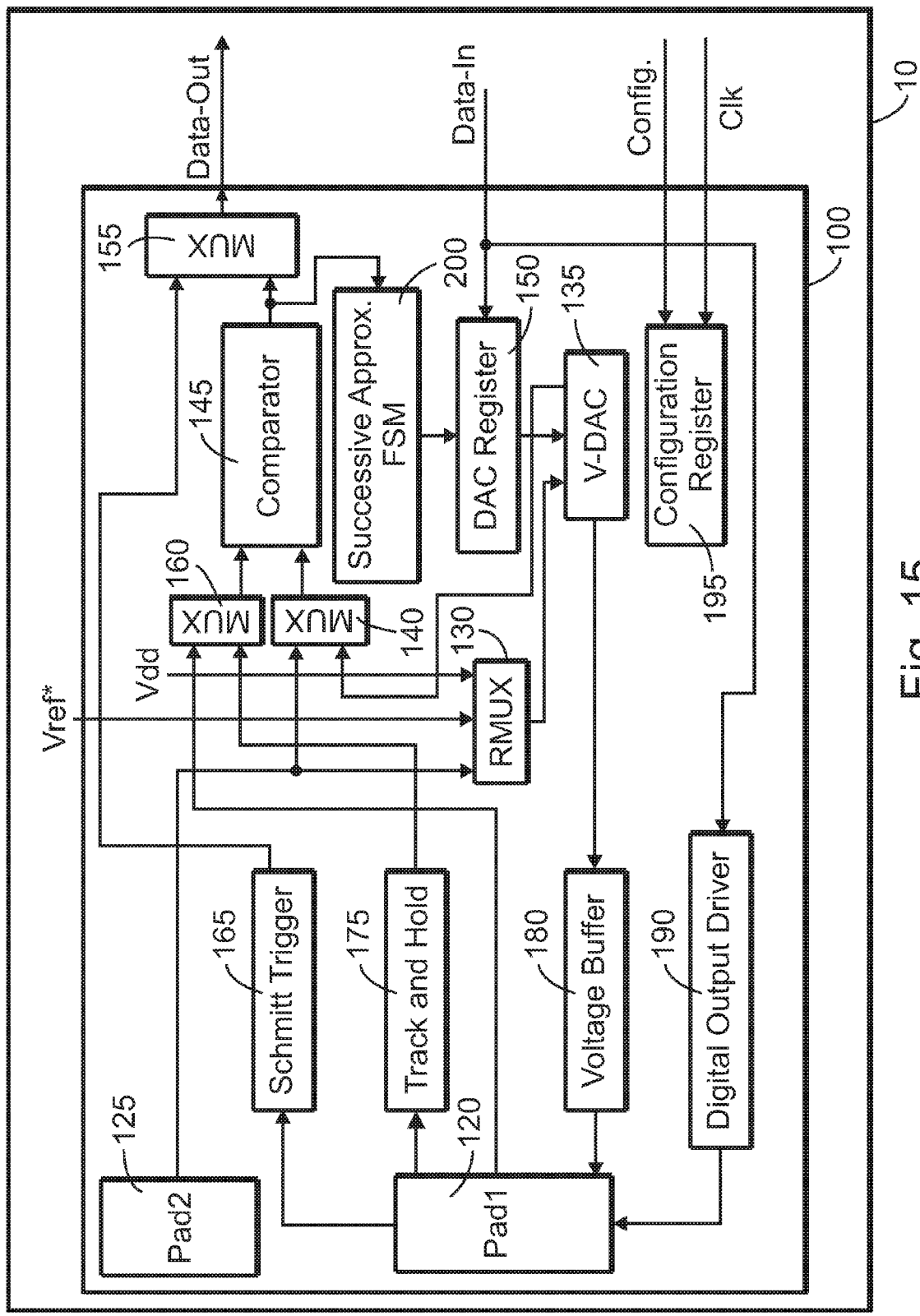

FIG. 15 shows a block diagram of an exemplary embodiment that includes a general embodiment of an MSIB 100 with reduced functionality compared to the MSIB 100 shown in FIG. 2. Compared to the MSIB 100 of FIG. 2, the MSIB 100 in FIG. 15 provides simpler analog/digital GPIO functionality.

More specifically, in the MSIB 100 of FIG. 15, the current DAC and delta sigma ADC modes are removed in order to save semiconductor area (and hence cost). The MSIB 100 of FIG. 15 provides full digital functionality, as well as full comparator functionality, one ADC mode, and one DAC mode.

Figure 16:
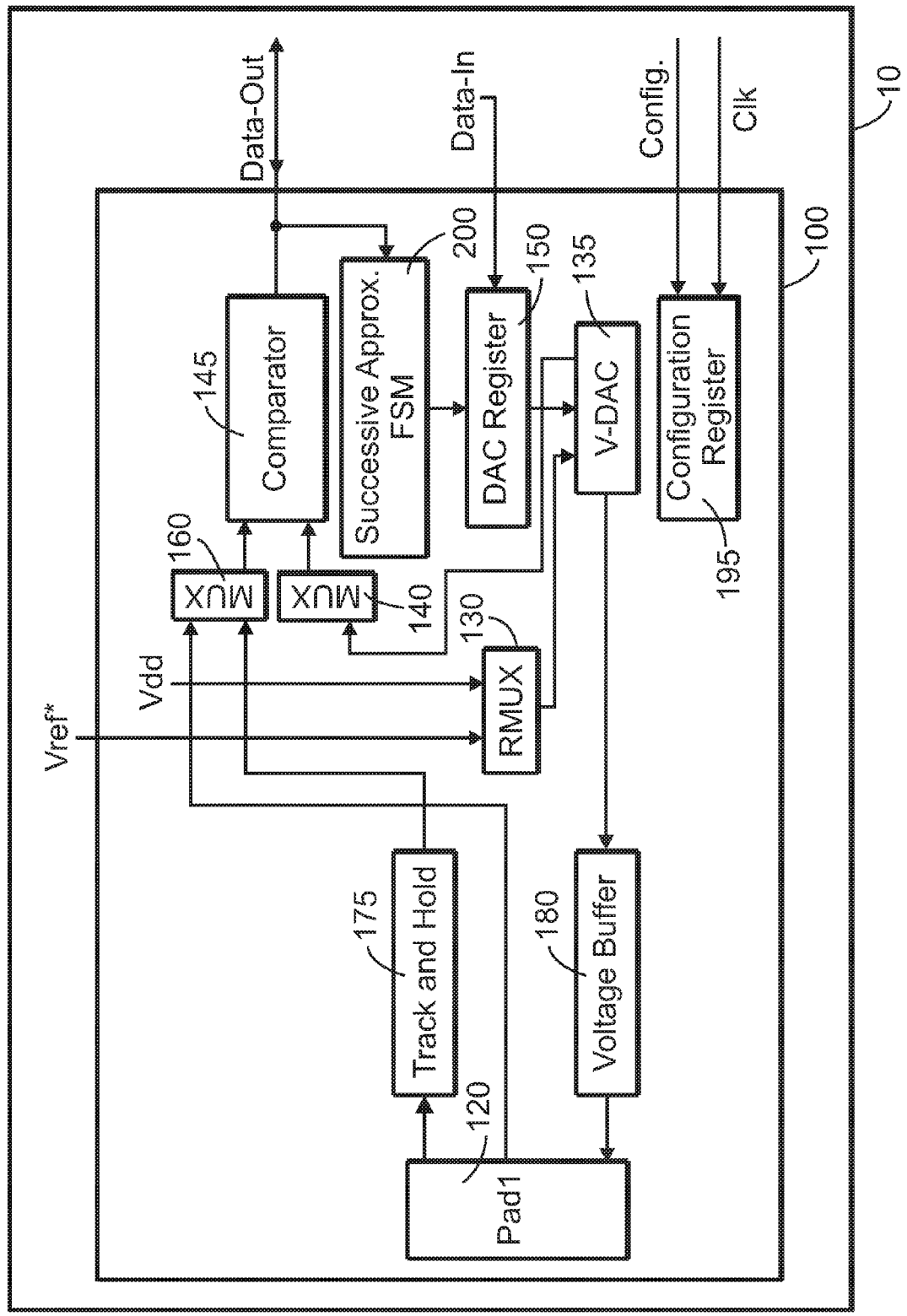

FIG. 16 shows a block diagram of an exemplary embodiment that includes a general embodiment of an MSIB 100 with reduced functionality compared to the MSIB 100 shown in FIG. 2. Specifically, the MSIB 100 in FIG. 16 provides analog GPIO functionality.

The MSIB 100 in FIG. 16 lacks differential and ratiometric modes, special digital circuits, and current DAC and delta sigma ADC modes (in order to reduce area and, hence, cost). Nevertheless, it maintains comparator, DAC, and ADC functionality. The MSIB 100 can receive and drive digital signals in response to analog signals.

In exemplary embodiments, some or all of the MSIB 100s may be implemented around pad circuitry (e.g., electrostatic discharge (ESD) protection circuitry, etc.). In other embodiments, MSIBs 100 may be implemented separately from the pad circuitry, and coupled to the respective pads or pad circuitry via suitable coupling mechanisms, as persons of ordinary skill in the art understand. As noted above, in some embodiments, a plurality of MSIBs 100 may be dedicated to a corresponding plurality of pads of IC 10.

As described above, the MSIBs 100 according to exemplary embodiments provide a flexible mechanism for providing interfacing and signal processing functions in mixed signal circuits and systems. By providing the ability to the designers to include and implement desired functions, the MSIBs 100 provide a way to balance desired functionality with semiconductor chip area, power consumption, manufacturing complexity, test complexity, cost, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An integrated circuit (IC), comprising:
   a plurality of pads to communicate with a plurality of sensors external to the IC; and
   a plurality of mixed signal interface blocks to process both analog and digital signals, the plurality of the mixed signal interface blocks coupled to a digital core of the IC via a plurality of corresponding digital interfaces, and coupled to the plurality of sensors via the plurality of pads;
   wherein each mixed signal interface block in the plurality of mixed signal interface blocks receives an analog input signal from a corresponding sensor in the plurality of sensors and converts the analog input signal to a digital signal in a plurality of digital signals simultaneously with other mixed signal interface blocks in the plurality of mixed signal interface blocks, and wherein the plurality of digital signals are provided to the digital core of the IC for processing.

2. The IC according to claim 1, wherein each mixed signal interface block in the plurality of mixed signal interface blocks senses the corresponding analog input signal in the plurality of analog signals independently of other mixed signal interface blocks in the plurality of mixed signal interface blocks.

3. The IC according to claim 1, wherein each mixed signal interface block in the plurality of mixed signal interface blocks is dedicated to a corresponding pad in the plurality of pads.

4. The IC according to claim 1, wherein the plurality of mixed signal interface blocks provide a set of configurable functions.

5. The IC according to claim 4, wherein the set of configurable functions comprises digital input and digital output functionality.

6. The IC according to claim 4, wherein the set of configurable functions comprises analog input functionality to process the corresponding analog input signal from a corresponding sensor in the plurality of sensors.

7. The IC according to claim 4, wherein the set of configurable functions comprises analog to digital conversion (ADC) functionality to convert the analog input signal to the corresponding digital signal in the plurality of digital signals.

8. The IC according to claim 4, wherein the set of configurable functions comprises digital to analog conversion (DAC) functionality.

9. The IC according to claim 1, wherein the plurality of pads comprises a subset of pads of the IC.

10. An integrated circuit (IC), comprising:
    a plurality of pads to communicate signals with a plurality of sensors external to the IC;
    a digital core to process and provide digital signals; and
    a plurality of mixed signal interface blocks to receive digital signals from the digital core of the IC and to provide bias signals to the plurality of sensors via the plurality of pads;
    wherein each mixed signal interface block in the plurality of mixed signal interface blocks converts a corresponding analog signal from a sensor in the plurality of sensors to a digital signal and provides the digital signal to the digital core of the IC for processing.

11. The IC according to claim 10, wherein at least one mixed signal interface block in the plurality of mixed signal interface blocks provides digital input functionality.

12. The IC according to claim 10, wherein at least one mixed signal interface block in the plurality of mixed signal interface blocks provides digital output functionality.

13. The IC according to claim 10, wherein at least one mixed signal interface block in the plurality of mixed signal interface blocks provides general purpose input/output (GPIO) functionality.

14. The IC according to claim 10, wherein at least one sensor in the plurality of sensors provides to the IC an analog signal representative of pressure.

15. The IC according to claim 10, wherein at least one sensor in the plurality of sensors provides to the IC an analog signal representative of temperature.

16. The IC according to claim 10, wherein each mixed signal interface block in the plurality of mixed signal interface blocks is coupled to core circuitry of the IC.

17. The IC according to claim 10, wherein the plurality of pads comprises a subset of pads of the IC.

18. A method of processing signals using a mixed signal integrated circuit (IC), the method comprising:
    receiving a plurality of analog signals from a plurality of sensors external to the mixed signal IC using a plurality of pads of the mixed signal IC;
    providing the received plurality of analog signals to a plurality of mixed signal interface blocks that process both analog and digital signals, the plurality of mixed signal interface blocks coupled to a digital core of the mixed signal IC via a plurality of corresponding digital interfaces, and coupled to the plurality of sensors via the plurality of pads;
    converting the plurality of analog signals to a plurality of digital signals, using the plurality of mixed signal interface blocks, wherein the converting by each mixed signal interface block in the plurality of mixed signal interface blocks is performed simultaneously with the converting by other mixed signal interface blocks in the plurality of mixed signal interface blocks; and
    providing the plurality of digital signals to the digital core of the mixed signal IC for processing.

19. The method according to claim 18, further comprising configuring the processing by each mixed signal interface block in the plurality of mixed signal interface blocks to provide at least one function in a set of functions.

20. The method according to claim 18, wherein each mixed signal interface block in the plurality of mixed signal interface blocks is dedicated to a corresponding pad in the plurality of pads.

* * * * *